(12) United States Patent
Ma (10) Patent No.: US 11,329,089 B1
(45) Date of Patent: May 10, 2022

(54) IMAGE SENSOR WITH MULTI-PATTERNED ISOLATION WELL

(71) Applicant: Gigajot Technology Inc., Pasadena, CA (US)

(72) Inventor: Jiaju Ma, Monrovia, CA (US)

(73) Assignee: Gigajot Technology, Inc., Pasadena, CA (US)

( * ) Notice: Subject to any disclaimer, the term of this patent is extended or adjusted under 35 U.S.C. 154(b) by 40 days.

(21) Appl. No.: 16/894,831

(22) Filed: Jun. 7, 2020

Related U.S. Application Data (60) Provisional application No. 62/858,953, filed on Jun. 7, 2019.

(51) Int. Cl.
*H01L 27/146* (2006.01)

(52) U.S. Cl.
CPC .... *H01L 27/1463* (2013.01); *H01L 27/14683* (2013.01)

(58) Field of Classification Search
None
See application file for complete search history.

(56) References Cited

U.S. PATENT DOCUMENTS

| | | | |
|---|---|---|---|
| 5,902,493 A | 5/1999 | Bae | |
| 5,905,020 A | 5/1999 | Hu et al. | |
| 6,753,586 B1* | 6/2004 | Holcombe | H01L 31/103 257/E31.112 |
| 7,800,146 B2* | 9/2010 | McKee | H01L 27/14603 257/292 |
| 7,935,477 B2 | 5/2011 | Hsu et al. | |
| 10,103,190 B2* | 10/2018 | Korobov | H01L 27/1463 |
| 2005/0164099 A1 | 7/2005 | Gelsomini | |
| 2006/0276014 A1 | 12/2006 | Hsu et al. | |
| 2009/0148796 A1 | 6/2009 | Heijden et al. | |
| 2010/0170871 A1 | 7/2010 | Sone et al. | |
| 2010/0244177 A1* | 9/2010 | Jeong | H01L 27/1463 257/463 |
| 2011/0201202 A1 | 8/2011 | Chang et al. | |
| 2018/0114813 A1 | 4/2018 | Pellizzer et al. | |

* cited by examiner

*Primary Examiner* — Ali Naraghi
(74) *Attorney, Agent, or Firm* — Charles Shemwell (57) ABSTRACT

Pixel isolation wells in a semiconductor image sensor are implemented via two or more photoresist patterning phases and two or more corresponding dopant implantation operations. A distinct photomask is applied in each patterning phase with the isolation-well street lines patterned by each mask spaced from one another by an integer multiple (i.e., 2 or greater) of the pixel pitch, and patterns formed by respective masks being staggered by the pixel pitch.

11 Claims, 6 Drawing Sheets

FIG. 1 Image Sensor With Multi-Patterned Isolation Wells

IMAGE SENSOR WITH MULTI-PATTERNED ISOLATION WELL

CROSS-REFERENCE TO RELATED APPLICATIONS

This application hereby claims priority to and incorporates by reference U.S. provisional application No. 62/858,953 filed Jun. 7, 2019.

TECHNICAL FIELD

The disclosure herein relates to integrated-circuit image sensors.

INTRODUCTION

In state-of-the-art CMOS image sensors, pixels are isolated from one another by p-doped wells typically formed through p-type ion implantation at distributed energies up to 2000 keV or higher. To prevent high-energy projectile dopant from entering the active pixel area (e.g., n-doped photowell), exceptionally thick photoresist (>2 µm) is applied to the epitaxial surface and then patterned for implantation doping. As pixel pitch drops further into the sub-micron range (pitch between pixels <1 µm), small lithography misalignment during the mask making process (i.e., mask for patterning the isolation well street lines) and/or nonuniform photoresist thickness over the epitaxial surface may distort the patterned photoresist and thus the implanted isolation well and neighboring pixel features, resulting in critical performance variation between pixels of a given sensor and between sensor chips.

DRAWINGS

The various embodiments disclosed herein are illustrated by way of example, and not by way of limitation, in the figures of the accompanying drawings and in which like reference numerals refer to similar elements and in which.

DETAILED DESCRIPTION

In various embodiments herein, pixel isolation wells are implemented via two or more photoresist patterning phases and two or more corresponding dopant implantation operations. A distinct photomask is applied in each patterning phase with the isolation-well street lines patterned by each mask spaced from one another by an integer multiple (i.e., 2 or greater) of the pixel pitch, and patterns formed by respective masks being staggered by the pixel pitch. In a two-phase multi-patterned isolation well formation, for example, a sacrificial photoresist layer is initially patterned with a first photomask to form street lines—channels in the photoresist deposition that define dopant implantation regions—with 2× (twice the pixel pitch) spacing in both row and column directions to enclose respective regions four times the area of an individual pixel. In the second phase, a second photoresist deposition (i.e., newly applied after first phase patterning and p-type ion implantation) is patterned with a second photomask that also forms 2×-spaced street lines, but with those street lines staggered by the pixel pitch in both the column and row directions (orthogonal axes) relative to the first-phase street lines and thus splitting each individual region (area) enclosed by the first-phase street lines into four pixel areas. The relaxed pitch in each of the multiple isolation-well patterning phases reduces photoresist feature distortion that plagues conventional single-mask isolation-well patterning (e.g., by reducing feature side-wall degradation and/or undue height loss), yielding a more uniform and precisely defined isolation-well implant throughout the pixel array and correspondingly improved image sensor performance (e.g., increased full-well capacity and thus increased dynamic range, reduced pixel-to-pixel cross-talk for improved resolution and modulation transfer function of produced images, etc.). These and other features and embodiments are described in further detail below.

Figure 1:
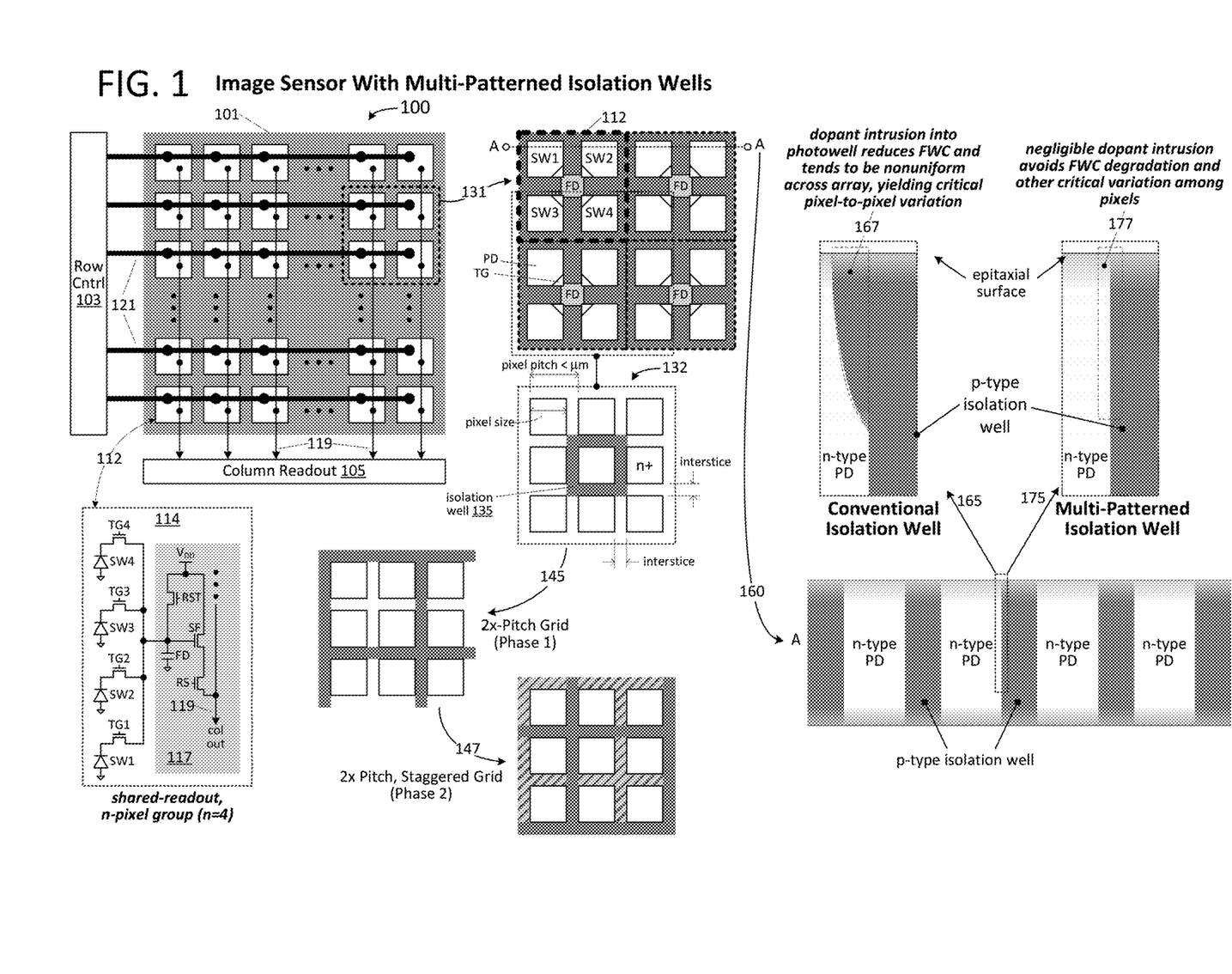
FIG. 1 illustrates an embodiment of image sensor having a pixel array with multi-patterned isolation wells, row control circuitry and column readout circuitry.

FIG. 1 illustrates an embodiment of image sensor 100 having a pixel array 101 with multi-patterned isolation wells, row control circuitry 103 and column readout circuitry 105. Pixel array 101 includes groups 112 of shared-readout pixels arranged in rows and columns of the array with each shared-readout pixel implemented by a respective photodetection element (e.g., photodiode that forms a photocarrier/photoelectron storage well or "photowell" as shown by "SW1" in pixel-group schematic view 114) and transfer gate (e.g., "TG1") coupled to a readout circuit 117 along with photodetection elements and transfer gates for a number of other pixels—SW2/TG2, SW3/TG3 and SW4/TG4 in this example and thus four pixels per shared-readout pixel group. Shared readout circuit 117 includes a capacitive floating diffusion node (FD), source-follower transistor (SF), read-select transistor (RS) and reset transistor (RST) coupled to form, together with the transfer gate and photodiode of each individual pixel, a respective four-transistor (4T) active pixel (i.e., effective per-pixel transistor count reduced by the sharing of the SF, RST and RS transistors) capable of correlated-double-sampled (CDS) readout via a column output line 119. Row control lines 121 are coupled respectively to the transfer gates (TG1-TG4), reset transistor and read-select transistor within each shared-readout pixel group 112 disposed in a given row of the pixel array, and a respective column output line 119 (or readout line) is coupled in common to constituent readout circuits 117 within each column of shared-readout pixel groups. Row controller 103 issues transfer gate signals (i.e., to switch on selected transfer gates TG), reset signals and read-select signals (to switch on selected reset transistors and read-select transistors) in a deterministic sequence to read out one or more pixels from each pixel group (i.e., generating respective readout signals indicative of photocharge accumulated within photowells SW1, SW2, SW3, SW4 one after another, or binned combinations of charge accumulated within those photowells) and column readout circuit 105 samples/digitizes the per-pixel or binned-pixel readout signals generated on output lines 119, forwarding the resulting digital pixel values to downstream circuitry for digital image construction and/or transmission of digital image data to a host integrated circuit (IC) component.

In the FIG. 1 example, constituent photodiodes of pixel array 101 are implemented by n-doped wells disposed in rows and columns with sub-micron pitch as shown by the exemplary detail views at 131 and 132—the former showing four pixel groups 112, each disposed in two-pixel by two-pixel layout (i.e., with the photodiodes/photowells, PD, for the pixels within each group of shared-readout pixels disposed radially around a respective central floating diffusion node, FD and switchably coupled to the floating diffusion node via a transfer gate, TG), and the latter demonstrating the uniform pixel pitch within and between pixel groups. The photodiode within each pixel independently resolves local light intensity information (i.e., during a given exposure interval) including, in cases where a color filter array (CFA) overlays the pixel array, resolving light intensity corresponding to a different color (i.e., range of wavelengths) than neighboring pixels. To suppress cross-talk between neighboring pixels (and thus improve the resolution and modulation transfer function of produced images), interstices between the photodiodes of respective pixels are patterned within a photoresist deposition and implanted with p-type dopant—for example, by executing multiple p-type implantations with uniformly distributed energies, including a maximum implantation energy that may reach or exceed 2000 keV—to produce p-type isolation wells (example at 135) that electrically isolate the photodiodes from one another (i.e., each isolation well surrounding a respective photodiode at least in a plane parallel to an illumination surface of the pixel array).

As explained above, the relatively thick photoresist necessary to block penetration of high-energy ions into the pixel area adjacent the isolation wells (i.e., during p-type isolation well implantation) is subject to increasing distortion/deformity as pixel pitch shrinks further into the sub-micron range. In the FIG. 1 embodiment, this photoresist distortion and resulting degradation due to dopant penetration into the pixel area is eliminated (or significantly lessened/mitigated) through composite formation of the p-type isolation well—executing two or more photoresist deposition/patterning operations and two or more corresponding dopant implantation operations, with each patterning operation forming well-implantation street lines that (i) have a pitch two times (2×) the pixel pitch or more, and (ii) are staggered relative to the street lines formed in a prior patterning operation by the pixel pitch. This multi-patterned composite isolation well formation is shown more specifically as a two-phase operation in FIG. 1—patterning a first grid composed of street lines with 2× pixel pitch as shown by grid fragment 145, and then (after p-type dopant implantation in the initially patterned grid) patterning a second grid (147) having street lines with 2× pixel pitch, staggered by the pixel pitch in both row and column directions and thus, after the second p-type implantation, yielding a composite isolation well structure with component implantations interlaced at the pixel pitch.

The exemplary cross-section 160 along A-A (through a neighboring pair of four-pixel groups) illustrates the electrical isolation between neighboring n-doped photowells ("n-type PD") effected p-type isolation well implantation. As shown in detail view 165, photoresist distortion within conventionally patterned isolation wells enables undesired dopant intrusion into the photowell (e.g., in the region shown at 167—resulting from dopant penetrating a relatively thin photoresist in a sloping sidewall that covers the photowell at the photowell/isolation-well interface), effectively reducing the size and full-well capacity (FWC) of the photowell. Due to practical uniformity in cross-array photoresist height and other factors, p-dopant intrusion into the photowell tends to be non-uniform across the pixel array, yielding pixel-to-pixel variation in critical performance metrics including, for example and without limitation, full-well capacity (in which the smallest/worst-case full well capacity typically defines the useable well capacity within all pixels of the array), cross-talk suppression, anti-blooming behavior, etc. Chip-level variation (i.e., between image sensors) may be even more pronounced, requiring performance binning and/or lowering fabrication yield.

As shown at 177 (in detail-view 175), p-dopant intrusion into the photowell region is negligible in the multipatterned isolation well formation, avoiding or at least mitigating full-well-capacity degradation and other critical pixel-to-pixel (or chip-level) variation.

Still referring to FIG. 1, though depicted feature dimensions are not necessarily to scale, even in the case of a sub-micron pixel (e.g., having an edge dimension of 0.8 µm, 0.5 µm or smaller) image sensor, the pixel pitch, pixel size and spacing between pixels (interstice and thus eventual isolation-well width) tends be many times greater than the minimum feature size (critical dimension) achievable with a given lithographic process. For example, in a CMOS image sensor implemented in a 65 nm process and having an 0.8 µm pixel and ~300 nm isolation-well width, the photowell width is roughly an order of magnitude larger than the minimum achievable feature size (critical dimension) and the isolation well width is more than four times the minimum achievable feature size. Ditto for a 0.5 µm pixel with a ~200 nm isolation-well width implemented in a 45 nm or 28 nm process. More generally, no aspect of the composite isolation well (much less any of the component structures) produced through multi-patterned lithography is limited by process rules (dimensions, optical proximity corrections, etc.) or otherwise constitutes a proximity-limited feature. Additionally, while square (aspect ratio=1.0) pixels are generally shown in FIG. 1 and embodiments discussed below, pixels having non-unity aspect ratios may be implemented in alternative embodiments, with photomask dimensions being adjusted according to the difference in pitch along orthogonal axes.

Figure 2:
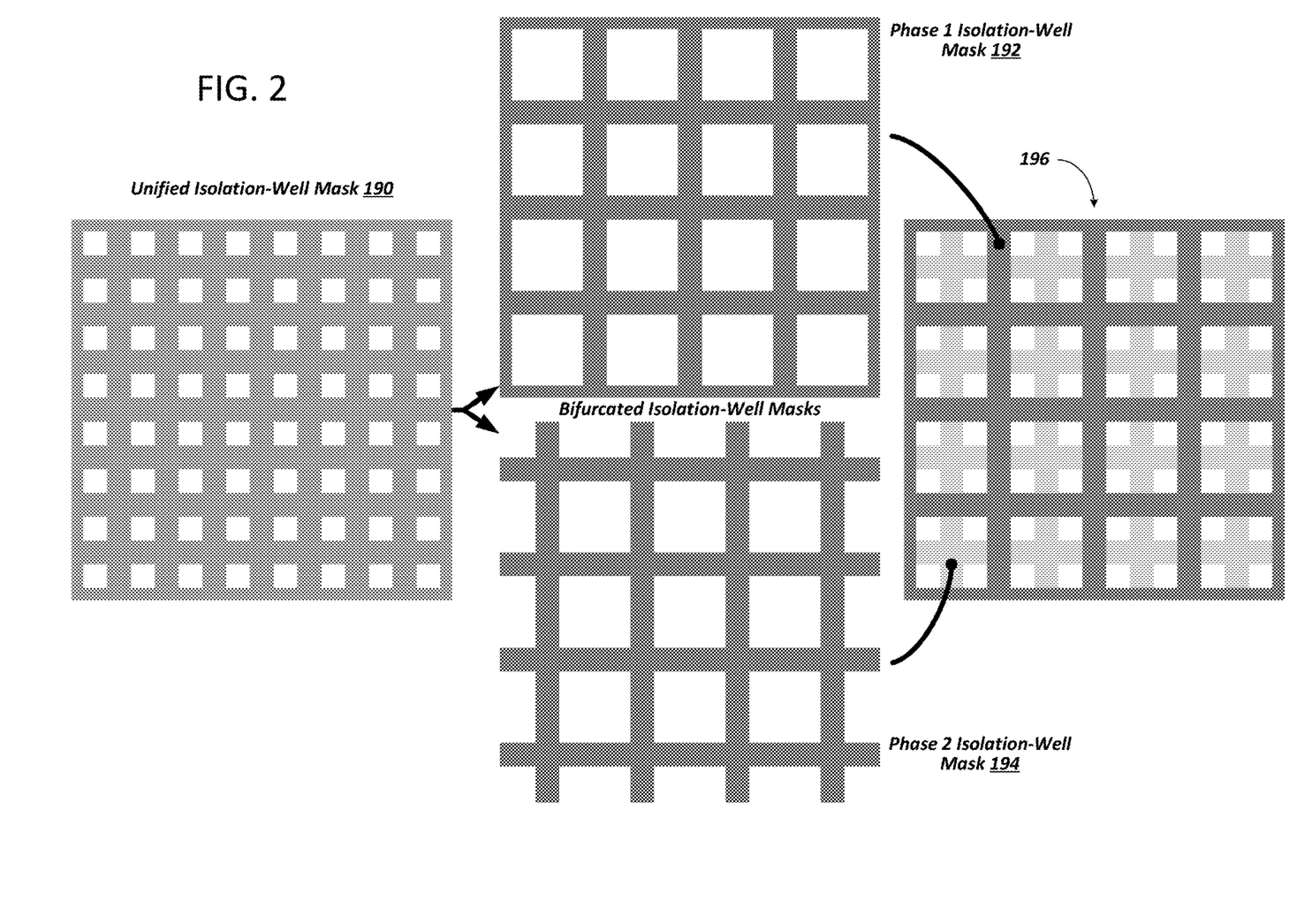
FIG. 2 illustrates bifurcation of a conceptually unified isolation-well patterning mask into two distinct pitch-relaxed and pitch-staggered photomasks and that may be successively applied to pattern respective and overlapping grids that define a composite isolation well structure.

FIG. 2 illustrates bifurcation of a conceptually unified isolation-well patterning mask into two distinct pitch-relaxed and pitch-staggered photomasks 192 and 194 that may be successively applied to pattern respective and overlapping grids that enable implantation of a composite isolation well structure—a two-phase multi-patterning in this instance. In the depicted example, each mask defines (enables lithographic patterning of) isolation-well street lines offset by twice the pixel pitch, with the street lines defined by mask 194 offset, relative to an edge of the mask or other array/wafer alignment point, from the street lines defined by 192 by the pixel pitch. An overlaid view of the two masks—corresponding to the composite set of street lines patterned by their successive application and thus composite (two-phase) isolation well implantation—is shown at 196, matching the conceptually unified structure shown at 190.

Figure 3:
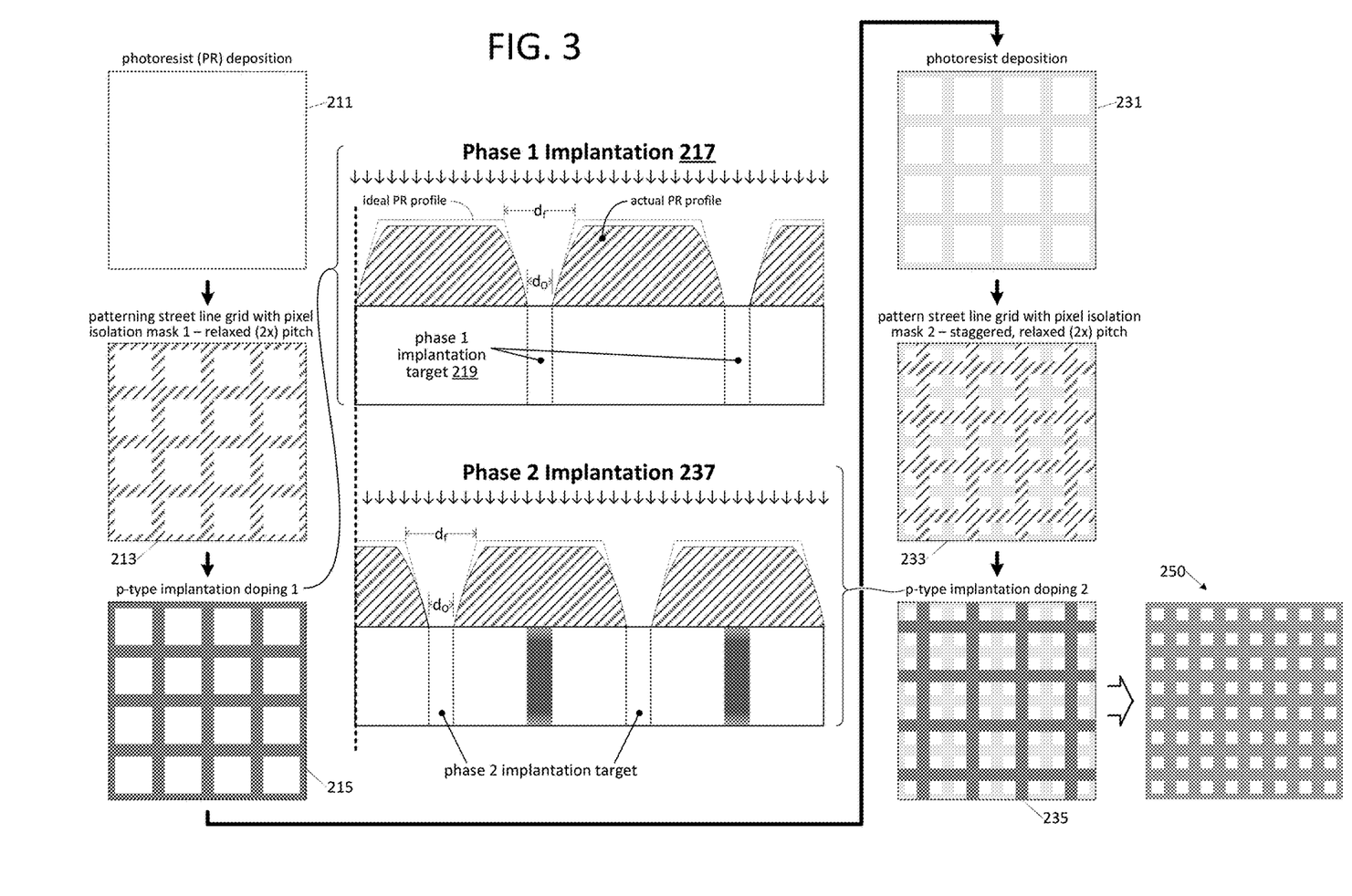
FIG. 3 illustrates a more detailed example of a two-phase isolation well fabrication process.

FIG. 3 illustrates a more detailed example of a two-phase isolation well fabrication process. A thick photoresist layer (e.g., greater than 2 µm, though depositions less than 2 µm may be used in some cases) is deposited (211) and then photolithographically patterned with a first 2× pitch (relaxed-pitch) pixel isolation mask to yield the phase-1 street lines shown at 213. After the initial street line patterning, p-type ions are implanted (e.g., with distributed energies up to and possibly exceeding 2 keV) as shown at 215 and 217 to dope the phase 1 isolation well component (i.e., the implantation targets shown at 219). In contrast to conventional single-mask patterning and single-phase dopant implantation, the dopant implantation aperture (photoresist-surface dimension $d_f$ and epitaxial-surface dimension $d_o$, which collectively define the amount of dopant that can be implanted into the epitaxial layer) tend to be highly uniform, thus yielding desired implantation profiles.

In the second-phase of the isolation well fabrication, after stripping residual phase-1 photoresist, a new layer of photoresist is deposited (231) and then patterned with a second 2× pitch pixel isolation mask (i.e., having a pitch-staggered pattern) to yield the phase-2 street lines shown at 233—that is street lines that are offset from the first-phase street lines by the pixel pitch in both the row and column directions. After the final street line patterning, p-type ions are implanted as shown at 235 and 237 to dope the phase 2 isolation well component with a desired density concentration and profile, yielding pixel-pitch isolation wells in the final composite structure as shown at 250.

Figure 4:
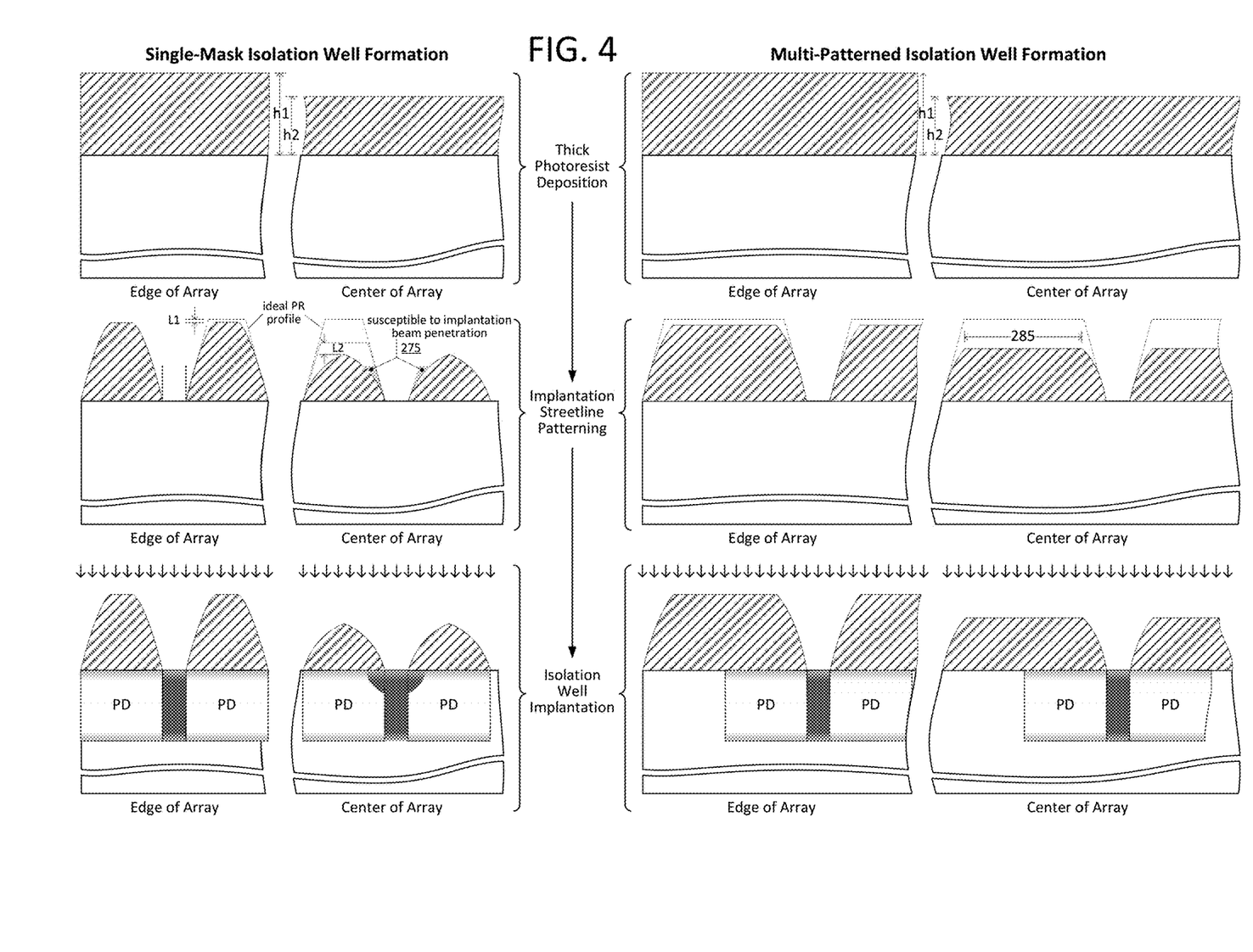
FIG. 4 contrasts single-mask isolation well formation with the two-phase well formation approach shown in FIG. 3.

FIG. 4 contrasts single-mask isolation well formation with the two-phase well formation approach shown in FIG. 3. In both cases the thick photoresist deposition is susceptible to height disparity across the array—in the depicted example, being taller (h1) at the edge of the array than in the center (h2) of the array (the reverse scenario as well as others are possible, including wafer-scale nonuniformity such that chip-to-chip variation in photoresist height/depth results). Upon isolation-well patterning with a single mask, the relatively shallow (low-height) regions of photoresist are further compromised due to the sub-micron street line pitch, yielding significantly distorted photoresist features (e.g., having insufficiently steep sidewalls and/or peak height due to loss of material (L2) as opposing sidewalls converge) that may be insufficient to block high-energy projectile dopant from penetrating into the underlying photowell region during p-well implantation. In the depicted example, photoresist abutting regions 275 is insufficiently thick to block ionic penetration and thus enable undesired intrusion of p-type dopant into the underlying area otherwise reserved (or occupied) by the n-type photowell. Adverse consequences include, for example and without limitation, reduced photowell capacity (which, as discussed above, may dictate a lowered/degraded full well capacity for the pixel array as a whole) and decreased well-overflow protection (anti-blooming). In other scenarios, the photoresist deformity (which may be aggravated by small lithographic errors during mask production and/or small mask alignment errors during photolithographic patterning) may reduce isolation well dopant density, increase variance in the dopant concentration gradient (e.g., through the depth and/or width of the target implantation region) and so forth—in all cases, reducing effective isolation between pixels and/or reducing photowell capacity so as to produce critical variation between pixels of a given image sensor and/or between image sensors singulated from a common wafer or even image sensors singulated from respective wafers fabricated with a given process.

Turning to the multi-patterned isolation well formation shown on the right-hand side of FIG. 4, the photoresist height disparity (h1>h2) remains, but the relaxed street line spacing in the two patterning phases avoids (or significantly mitigates) degradation of patterned photoresist features. In the depicted example, for instance, the wider photoresist surface region between feature sidewalls (i.e., along dimension 285) prevents convergence of those sidewalls and thus prevents, for example, the sidewall deformation (reduced gradient) and peak-height diminution that plagues the single-mask-patterning approach. The increased integrity of patterned photoresist features, in turn, enables implantation of a more effective isolation well (e.g., more uniform dopant depth and concentration profile across the array and between ICs, more clearly defined interface between isolation well and photowell) with negligible dopant intrusion into the adjacent photowell region.

Figure 5:
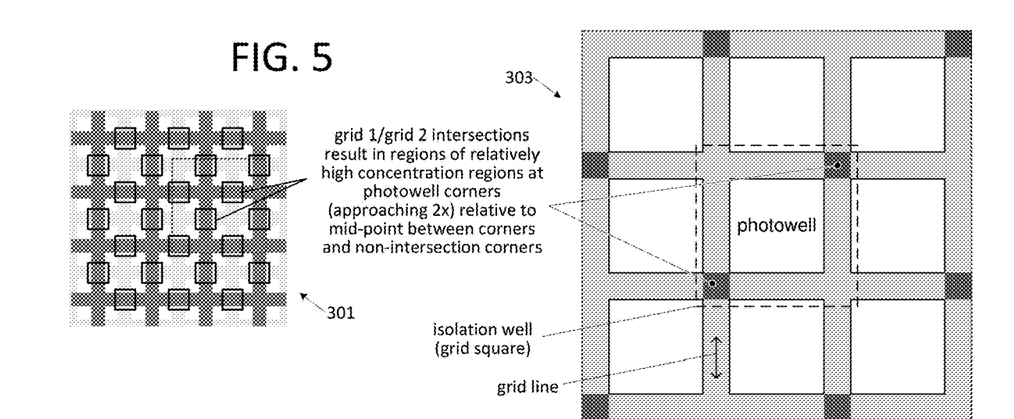
FIG. 5 illustrates regions of intersection/overlap between separately patterned and doped phase-1 and phase-2 isolation-well component grids.
Figure 6:
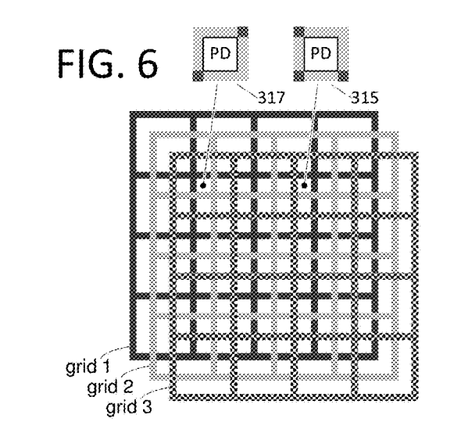
FIG. 6 illustrates an exemplary a three-phase multi-patterning approach in which three component isolation-well grids are patterned and implanted to form a three-part composite isolation well structure.

Returning briefly to FIG. 2, intersections of the street lines implemented by the first and second patterning operations (i.e., at corners of each pixel where the two dopant-implantation grids overlap) will generally have higher dopant density relative to rest of the isolation well—nominally the sum of the densities implanted in each implantation phase and thus twice the dopant density of the isolation-well regions outside the corner intersections (i.e., in cases of equal phase-1/phase-2 dopant implantation). FIG. 5 illustrates regions of intersection/overlap (301) between separately patterned and doped phase-1 and phase-2 isolation-well component grids—regions of relatively high dopant concentration (i.e., nominally twice the concentration at, for example, the isolation-well mid-point between any two corner intersections due to the implantation in those regions in each of two implantation phases) referred to herein as high-concentration corners. As shown in detail view 303, a two-phase isolation-well patterning and implantation in which the second grid is shifted by the pixel pitch relative to the first yields high concentration corners in two opposing/diagonal corners for each pixel (or photowell)—occurring at every other intersection along a given grid line. Because the p-type implantation is high-energy, the duplicate implants (i.e., producing high concentration corners symmetrically across the pixel array—two per pixel) will not have noticeable impact on the surface dopant concentration which defines the threshold voltages of in-pixel transistors. In general, the maximum number of high-concentration corners bounding a photowell in a pixel array having a multi-patterned isolation well is equal to the number of patterning/implantation phases, N. For example, in a three-phase multi-patterned isolation well (N=3) in which three component isolation-well grids are patterned and implanted to form a three-way composite isolation well structure as shown in FIG. 6 (i.e., each grid staggered by the pixel pitch from the other two), at least some photodiodes will be bounded by three high-concentration corners (315) (though others will be bounded by only two at diagonal vertices as shown at 317).

Figure 7:
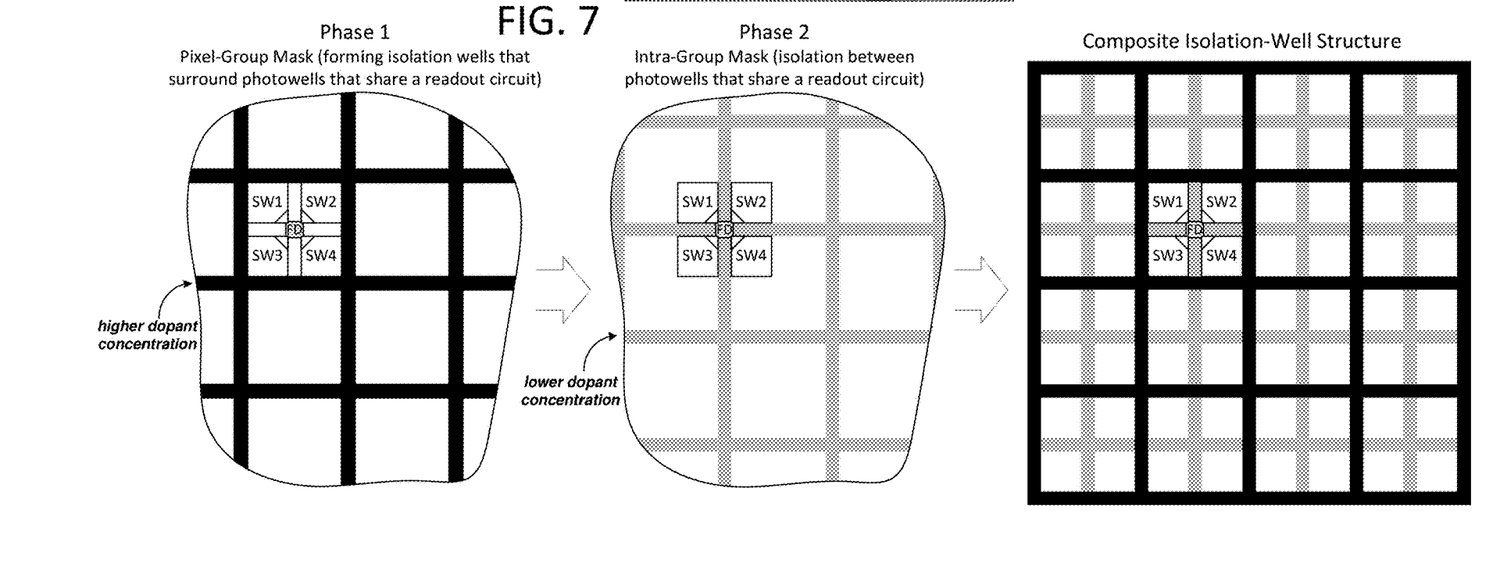
FIG. 7 illustrates two-phase formation of a composite isolation-well structure in which different dopant concentrations are implanted in each phase.

FIG. 7 illustrates two-phase formation of a composite isolation-well structure in which different dopant concentrations are implanted in each phase. More specifically, in a first patterning/doping phase, a pixel-group mask is applied to pattern a "pixel-group" grid in which the grid squares (or apertures) isolate individual groups of M×M pixels (2×2 and thus four photowells in the depicted example) from each other. Thereafter, a second intra-group mask is applied to pattern an intra-group grid having individual street lines (i.e., grid lines after dopant implantation) that isolate the photowells of a given pixel group from one another. In one embodiment, a higher dopant concentration is implanted in the pixel-group grid pattern than in the intra-group grid pattern—the higher concentration pixel-group grid providing strong group-to-group isolation and the lower intra-group concentration enabling, for example, increased full-well capacity and fill-factor. As in embodiments discussed above, intersections between grid lines in the intra-group and pixel-group grids will have dopant concentrations nominally equal to the sum of the concentrations implanted in the two doping steps. In an embodiment in which the intra-group grid concentration is approximately half the pixel-group grid concentration, for example, the high-concentration corners will have nominal concentrations approximately three-times the intra-group grid line concentration (i.e., outside the intersection) and 1.5 times the pixel-group grid line concentration.

Figure 8:
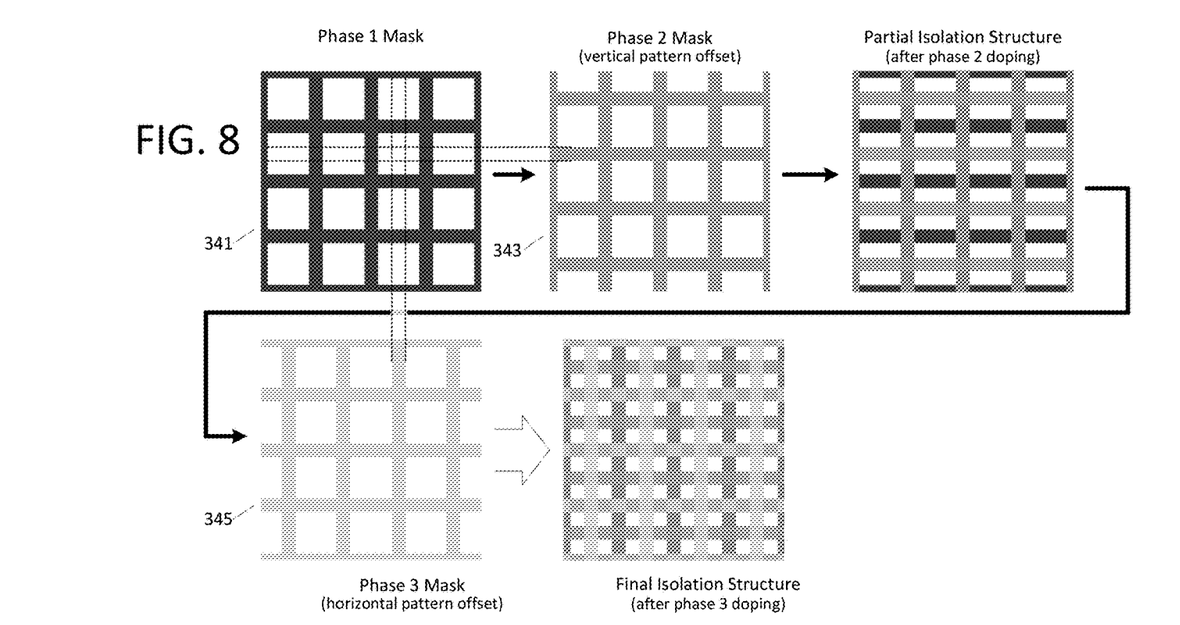
FIG. 8 illustrates an exemplary three-phase multi-patterned isolation-well formation in which second-phase and third-phase grid patterns are shifted by the pixel pitch in respective orthogonal directions relative to a first-phase grid pattern.

FIG. 8 illustrates an exemplary three-phase multi-patterned isolation-well formation in which second-phase and third-phase grid patterns are shifted by the pixel pitch in respective orthogonal directions—one horizontally, the other vertically—relative to a first-phase grid pattern. Thus, grid is patterned with a phase 1 photomask, followed (after phase 1 implantation), by patterning of vertically pixel-pitch-shifted grid 343 with a phase 2 mask and then (after phase 2 implantation), patterning of a horizontally pixel-pitch shifted grid 345 with a phase 3 mask. After phase 3 doping, each grid square in the composite isolation well structure will include four high-concentration corners, each formed by the intersection of grid lines from two of the three dopant grids.

Figure 9:
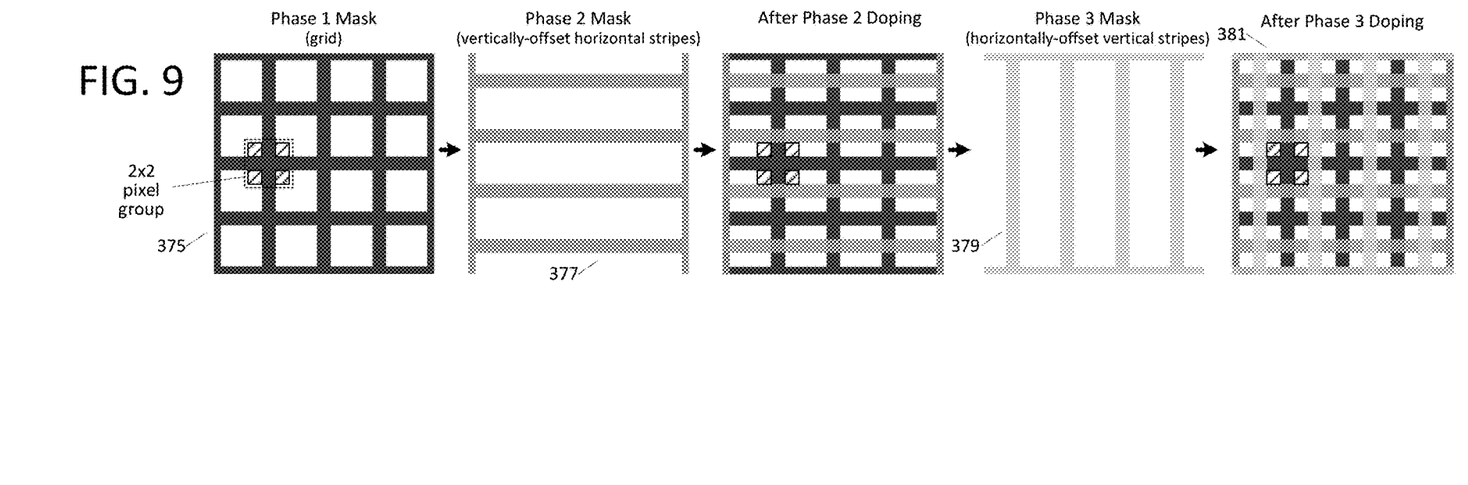
FIG. 9 illustrates another exemplary three-phase isolation-well formation in which the second and third phase dopant-implantation patterns are pixel-pitch shifted in respective orthogonal directions relative to a first-phase grid pattern, but with striped second-phase and third-phase masks, rather than grids.

FIG. 9 illustrates another exemplary three-phase isolation-well formation in which the second and third phase dopant-implantation patterns are pixel-pitch shifted in respective orthogonal directions relative to a first-phase grid pattern (375), but with striped second-phase and third-phase masks (377, 379), rather than grids. That is, vertically-offset horizontal stripes are patterned and implanted in phase 2 and then horizontally-offset vertical stripes are patterned and implanted in phase 3 (an order which may be reversed) to yield the composite isolation-well structure shown at 381. By forming the first-phase grid pattern such that individual first-phase grid lines form the isolation between pixels in a shared-readout group, high-concentration corners/grid-line intersections are avoided within the pixel groups (i.e., as can be seen by the disposition of a 2×2 pixel group within the structure after each of the three doping phases). Additionally, each 2×2 pixel group is bounded by an isolation grid square having eight high-concentration regions—four at the corners and four at respective mid-points of the grid lines that extend between the high-concentration corners. Noting the rotational symmetry between the phase 2 and phase 3 masks (377, 379), the same mask may be used for each of the phase 2 and phase 3 patterning operations (i.e., rotating by 90 degrees after the phase 2 patterning and doping). More generally, though separate photomasks are generally described herein for respective patterning phases, a given mask may be realigned (moved laterally by the pixel pitch in either or both orthogonal directions of the pixel array) and applied for the subsequent patterning operation(s). Similarly, dopant implantation following in each patterning step may be uniform or disparate according to desired concentration in relation to pixel array features.

The various embodiments of integrated circuit image sensors, component circuit elements, fabrication elements (e.g., photomasks) and so forth disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, computer storage media in various forms (e.g., optical, magnetic or semiconductor storage media, whether independently distributed in that manner, or stored "in situ" in an operating system).

When received within a computer system via one or more computer-readable media, such data and/or instruction-based expressions of the above described integrated circuits and associated fabrication elements can be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image can thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the disclosed embodiments. In some instances, the terminology and symbols may imply details not required to practice those embodiments. For example, any of the specific shared-readout pixel architectures, number or layout of pixels per readout circuit, pixel pitch dimensions, isolation well dimensions (or other dimensions), numbers of patterning/implantation phases in a multipatterned fabrication, and the like can be different from those described above in alternative embodiments. The term "coupled" is used herein to express a direct connection as well as a connection through one or more intervening functional components or structures. The terms "exemplary" and "embodiment" are used to express an example, not a preference or requirement. Also, the terms "may" and "can" are used interchangeably to denote optional (permissible) subject matter. The absence of either term should not be construed as meaning that a given feature or technique is required.

Various modifications and changes can be made to the embodiments presented herein without departing from the broader spirit and scope of the disclosure. For example, features or aspects of any of the embodiments can be applied in combination with any other of the embodiments or in place of counterpart features or aspects thereof. Accordingly, the specification and drawings are to be regarded in an illustrative rather than a restrictive sense.

What is claimed is:

1. An integrated circuit image sensor comprising:
   a pixel array having constituent pixels disposed in rows and columns within a semiconductor substrate; and
   doped isolation wells each surrounding a respective one of the pixels in at least one plane and having higher dopant concentration in at least one region of overlap with a neighboring isolation well than in regions that do not overlap with the neighboring isolation well.

2. The integrated circuit image sensor of claim 1 wherein the doped isolation wells are formed by:
   depositing a first photoresist layer over a semiconductor substrate;
   patterning a first grid in the photoresist layer using a first photomask, the first grid having first street lines spaced from one another by a first pitch;
   doping the semiconductor substrate in a pattern defined by the first grid
   depositing a second photoresist layer over the semiconductor substrate;
   patterning a second grid in the second photoresist layer using a second photomask, the second grid having second street lines spaced from one another by the first pitch and respectively spaced from the first street lines by not more than half the first pitch; and
   doping the semiconductor substrate in a pattern defined by the second grid.

3. The integrated circuit image sensor of claim 2 wherein the first and second grids overlap one another such that the first street lines and second street lines intersect to form, after doping in the patterns defined by the first and second grids and with respect to each doped isolation well, the at least one region of overlap having the higher dopant concentration.

4. The integrated circuit image sensor of claim 2 wherein patterning the first grid having first street lines spaced from one another by a first pitch comprises:
   patterning street lines that extend along a first axis and are offset from one another by the first pitch; and
   patterning street lines that extend along a second axis orthogonal to the first axis.

5. The integrated circuit image sensor of claim 4 wherein patterning street lines that extend along the second axis comprises patterning street lines that extend along the second axis and are offset from one another by a second pitch different from the first pitch.

6. The integrated circuit image sensor of claim 2 wherein doping the semiconductor substrate in a pattern defined by the first grid comprises implanting dopant into the semiconductor substrate in the pattern defined by the first grid using a distribution of implantation energies, including at least one implantation energy at or above 2000 keV.

7. The integrated circuit image sensor of claim 2 wherein the first and second grids overlap to define a third grid having third street lines, constituted by the first and second street lines, spaced from one another according to a desired pitch between neighboring pixels of the pixel array.

8. The integrated circuit image sensor of claim 2 wherein patterning the first grid having first street lines and patterning the second grid having second street lines comprises patterning each of the first and second street lines with a minimum dimension at least twice as large as a feature lithographically patterned within a pixel of the pixel array.

9. The integrated circuit image sensor of claim 2 wherein patterning the first grid having first street lines and patterning the second grid having second street lines comprises patterning each of the first and second street lines with a minimum dimension larger than 150 nanometers in a lithographic process capable of defining a feature smaller than 80 nanometers.

10. The integrated circuit image sensor of claim 2 wherein each pixel comprises a photodiode disposed in an area bounded in part by dopant within the semiconductor substrate resulting from doping in the pattern defined by the first grid and bounded in part by dopant within the semiconductor substrate resulting from doping in the pattern defined by the second grid.

11. The integrated circuit image sensor of claim 1 wherein, for each of the doped isolation wells having the higher dopant concentration in at least one region of overlap with the neighboring isolation well, the neighboring isolation well is disposed cater-corner to the doped isolation well having the higher dopant concentration in the at least one region of overlap such that the at least one region of overlap constitutes a corner of the doped isolation well.

* * * * *